(12) United States Patent
Kang et al.

(10) Patent No.: US 11,056,158 B2
(45) Date of Patent: Jul. 6, 2021

(54) MEMORY DEVICE AND DIVIDED CLOCK CORRECTION METHOD THEREOF

(71) Applicant: Samsung Electronics Co., Ltd., Suwon-si (KR)

(72) Inventors: Dong-Seok Kang, Hwaseong-si (KR); Seungjun Bae, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 16/571,868

(22) Filed: Sep. 16, 2019

(65) Prior Publication Data
US 2020/0013441 A1 Jan. 9, 2020

Related U.S. Application Data

(63) Continuation of application No. 15/689,260, filed on Aug. 29, 2017, now Pat. No. 10,453,504.

(30) Foreign Application Priority Data

Sep. 26, 2016 (KR) .................. 10-2016-0123276

(51) Int. Cl.
*G11C 7/10* (2006.01)
*G06F 3/06* (2006.01)
(Continued)

(52) U.S. Cl.
CPC .......... *G11C 7/1072* (2013.01); *G06F 3/0632* (2013.01); *G11C 7/222* (2013.01); *G11C 29/022* (2013.01); *G11C 29/023* (2013.01); *G11C 29/028* (2013.01); *H03L 7/085* (2013.01); *H03L 7/0807* (2013.01); *H03L 7/0814* (2013.01);
(Continued)

(58) Field of Classification Search
CPC ... G11C 7/1072; G11C 29/022; G11C 29/028; G11C 29/023; G11C 7/222; G11C 2207/2254; H03L 7/091; H03L 7/0814; H03L 7/0807; H03L 7/085; H03L 7/0812; H04L 7/10; H04L 7/0337; H04L 7/0037;
(Continued)

(56) References Cited

U.S. PATENT DOCUMENTS 6,397,361 B1 5/2002 Saitoh
6,735,710 B1 5/2004 Yoshikawa
(Continued)

FOREIGN PATENT DOCUMENTS

JP 2000183739 6/2000
KR 20030020124 3/2003
(Continued)

*Primary Examiner* — Francisco A Grullon
(74) *Attorney, Agent, or Firm* — Myers Bigel, P.A

(57) ABSTRACT

A memory device includes an internal clock generator, a deserializer, a data comparator, and a clock controller. The internal clock generator generates a plurality of internal clock signals, which have different phases from each other, by dividing a clock signal received from a host. The deserializer deserializes serial test data received from a host as pieces of internal data using the internal clock signals. The data comparator compares reference data with the internal data. The clock controller corrects a clock dividing start time point of the clock signal of the internal clock generator based on the result of the comparison of the reference data and the internal data.

13 Claims, 14 Drawing Sheets

(51) Int. Cl.

| | | |
|---|---|---|
| *H03L 7/091* | (2006.01) | |
| *H03L 7/081* | (2006.01) | |
| *G11C 29/02* | (2006.01) | |
| *H03L 7/08* | (2006.01) | |
| *H04L 7/10* | (2006.01) | |
| *H04L 7/033* | (2006.01) | |
| *G11C 7/22* | (2006.01) | |
| *H03L 7/085* | (2006.01) | |
| *H04L 7/00* | (2006.01) | |
| *H04L 7/08* | (2006.01) | |
| *H04L 25/02* | (2006.01) | |

(52) U.S. Cl.
CPC ............ *H03L 7/091* (2013.01); *H04L 7/0037* (2013.01); *H04L 7/0337* (2013.01); *H04L 7/08* (2013.01); *H04L 7/10* (2013.01); *H04L 25/0274* (2013.01); *H04L 25/0288* (2013.01); *G11C 2207/2254* (2013.01)

(58) Field of Classification Search
CPC ... H04L 7/08; H04L 25/0274; H04L 25/0288; G06F 3/0632
See application file for complete search history.

(56) References Cited

U.S. PATENT DOCUMENTS

| | | | |
|---|---|---|---|
| 6,834,367 B2 | 12/2004 | Bonneau | |
| 7,320,045 B2 | 1/2008 | Randell | |
| 7,363,563 B1 * | 4/2008 | Hissen | ................... H04L 1/243 327/144 |
| 7,571,267 B1 | 8/2009 | Luis | |
| 7,791,370 B1 * | 9/2010 | Hoang | ...................... G06F 1/10 326/38 |
| 7,800,416 B2 | 9/2010 | Kim | |
| 7,889,595 B2 | 2/2011 | Park | |
| 7,902,887 B2 | 3/2011 | Bae | |
| 7,957,497 B2 | 6/2011 | Bae | |
| 8,489,911 B1 | 7/2013 | Hill | |
| 8,503,254 B2 | 8/2013 | Park | |
| 8,593,901 B2 | 11/2013 | Oh | |
| 8,594,264 B1 * | 11/2013 | Zhu | ........................ H03L 7/085 375/371 |
| 8,687,457 B2 | 4/2014 | Park | |
| 9,030,907 B2 | 5/2015 | Na | |
| 9,667,406 B2 * | 5/2017 | Ware | ......................... H04L 7/10 |
| 2005/0047495 A1 | 3/2005 | Yoshioka | |
| 2005/0108600 A1 | 5/2005 | Arguelles | |
| 2005/0286643 A1 | 12/2005 | Ozawa | |
| 2006/0056498 A1 | 3/2006 | Clancy | |
| 2008/0031385 A1 | 2/2008 | Aung | |
| 2008/0175310 A1 | 7/2008 | Okamura | |
| 2010/0054073 A1 * | 3/2010 | Park | ....................... G11C 7/109 365/233.1 |
| 2010/0232489 A1 | 9/2010 | Watkins | |
| 2010/0325372 A1 * | 12/2010 | Housty | ............... G06F 13/1689 711/154 |
| 2011/0075781 A1 * | 3/2011 | Kenney | ................... H03L 7/235 375/376 |
| 2012/0066464 A1 | 3/2012 | Zitlaw | |
| 2014/0016404 A1 * | 1/2014 | Kim | ..................... G11C 7/1057 365/158 |
| 2014/0281192 A1 * | 9/2014 | Gilda | .................... G06F 3/0656 711/105 |
| 2015/0043698 A1 | 2/2015 | Chang | |
| 2017/0093558 A1 | 3/2017 | Ramezani | |
| 2018/0006849 A1 * | 1/2018 | Jang | ................. H04L 25/03273 |

FOREIGN PATENT DOCUMENTS

| | | |
|---|---|---|
| KR | 100771544 | 10/2007 |
| KR | 100896462 | 5/2009 |
| KR | 20100030226 | 3/2010 |
| KR | 101027673 | 3/2011 |

\* cited by examiner

MEMORY DEVICE AND DIVIDED CLOCK CORRECTION METHOD THEREOF

CROSS-REFERENCE TO RELATED APPLICATION

This application is a continuation of U.S. patent application Ser. No. 15/689,260, filed Aug. 29, 2017, which itself claims priority under 35 U.S.C. § 119 to Korean Patent Application No. 10-2016-0123276, filed Sep. 26, 2016 in the Korean Intellectual Property Office, the entire contents of these applications are incorporated herein by reference in their entireties.

BACKGROUND

The inventive concepts described herein relate to a semiconductor memory system, and more particularly, to a memory device and a divided clock correction method thereof.

There is demand for electronic devices that provide high performance and low power consumption. As electronic devices are designed to operate at lower power levels, the number of times that a memory system of an electronic device enters into a mode in which the memory system interrupts an operation is increasing.

The memory system may be a volatile memory device or a nonvolatile memory device. A synchronous dynamic random access memory (SDRAM) is a typical example of a volatile memory device. The SDRAM processes input/output data and a command/address signal in synchronization with a clock signal that is provided from a host. The quality of the clock signal may influence the performance of the memory device.

The memory device may enter into a mode in which an operation is interrupted. When such an interruption occurs, the clock signal may not be provided from the host. When the memory device exits from the interrupt mode and resumes normal operation, settings for operation of the memory device may be initialized. Settings of a clock circuit in the memory device may be also initialized when the settings for operation of the memory device are initialized. Accordingly, clock signals that are respectively provided from the memory device and the host may not be synchronized with each other when normal operation resumes after operations were interrupted.

SUMMARY

Embodiments of the inventive concept provide a memory device that corrects a clock dividing start time point of an internal clock signal and a divided clock correction method thereof.

According to an embodiment of the inventive concepts, a memory device includes an internal clock generator, a deserializer, a data comparator, and a clock controller. The internal clock generator is configured to generate a plurality of internal clock signals by dividing a clock signal that received from a host, where each of the internal clock signals has a respective phase that is different from the phases of the other internal clock signals. The deserializer is configured to use the internal clock signals to deserialize serial test data which is received from the host. The data comparator is configured to compare reference data with pieces of internal data that correspond to the deserialized serial test data. The clock controller is configured to correct a clock dividing start time point of the clock signal that is received from the host based on a result of the comparison of the reference data to the pieces of internal data.

According to another embodiment of the inventive concepts, a method for correcting a clock dividing start time point of a memory device includes receiving, at the memory device, serial test data from a host, deserializing the serial test data received from the host using a plurality of internal clock signals that are generated by dividing a clock signal that is received from the host, comparing reference data with pieces of internal data that correspond to the deserialized test data, and correcting a clock dividing start time point of the clock signal based on the comparison of the reference data with the pieces of internal data.

According to another embodiment of the inventive concepts a memory device is provided that includes an internal clock generator that is configured to generate a plurality of internal clock signals by dividing a clock signal that is received from a host, where each of the internal clock signals has a respective phase that is different from the phases of the other internal clock signals; a serializer that is configured to use the internal clock signals to serialize training data; a data output that is configured to output the serialized training data to the host; and a clock controller that is configured to correct a clock dividing start time point of the clock signal that is received from the host based on a control signal provided by the host. A value of the control signal is based on a time that the serialized training data was received at the host.

According to another embodiment of the inventive concepts, a method for correcting a clock dividing start time point of a memory device is provided in which serial test data that is received from a host is sampled using a plurality of internal clock signals to deserialize the serial test data, where the serial test data is sampled using one of a rising edge and a falling edge of each of the internal clock signals. The memory device is then configured to sample data that is received from the host using the other of the rising edge and the falling edge of each of the internal clock signals if it is determined that the deserialized serial test data was deserialized out of order.

According to another embodiment of the inventive concepts a method for correcting a clock dividing start time point of a memory device is provided in which test data is serialized to provide a serialized data pattern using a plurality of internal clock signals that are generated by dividing a clock signal that is received from the host. Reference data is compared with the serialized data pattern. The clock dividing start time point of the clock signal is corrected based on the comparison of the reference data with the serialized data pattern.

DETAILED DESCRIPTION

Figure 1:
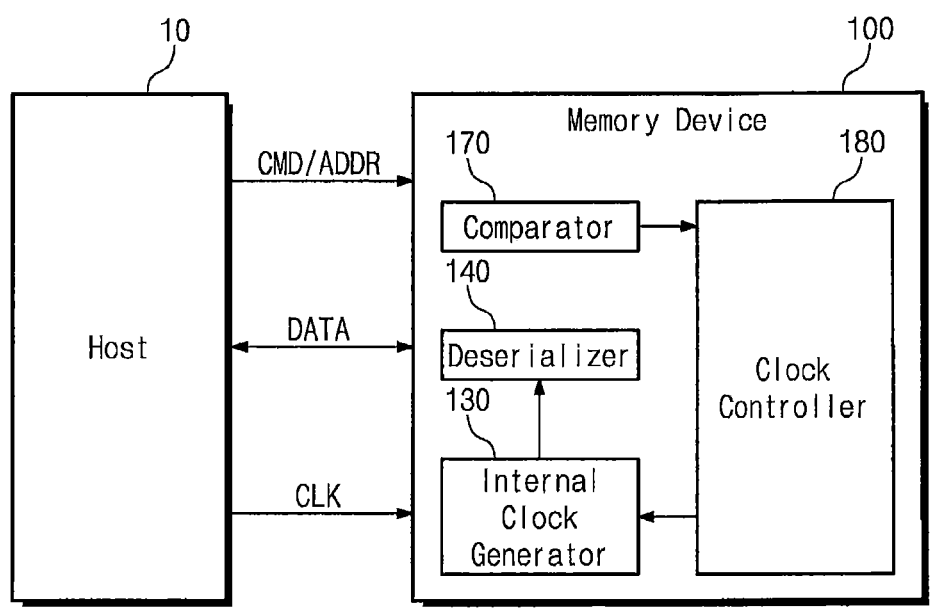
FIG. 1 is a block diagram of a memory system according to an embodiment of the inventive concepts.

FIG. 1 is a block diagram illustrating a memory system 1 according to an embodiment of the inventive concepts. The memory system 1 may include a host 10 and a memory device 100. The memory system 1 may be a single system including both the host 10 and the memory device 100. Alternatively, the host 10 and the memory device 100 of the memory system 1 may be implemented as separate and distinct devices.

The host 10 may be a memory system or a processor circuit, and may include, for example, a general-purpose processor or an application processor. Alternatively, the host 10 may be any of the following computing devices that include one or more processors: a personal computer, a peripheral device, a digital camera, a personal digital assistant (PDA), a portable media player (PMP), a smartphone, or a wearable device. However, the above-described examples do not limit the embodiments of the inventive concepts.

The memory device 100 may store data provided from the host 10 or data to be provided to the host 10. The memory device 100 may include one or more storage mediums. One of the storage mediums may be a volatile memory. For example, the memory device 100 may include a dynamic random access memory (DRAM), a static random access memory (SRAM), a thyristor RAM (TRAM), a zero capacitor RAM (Z-RAM), a twin transistor RAM (TTRAM), a magnetoresistive RAM (MRAM), etc. Embodiments of the inventive concepts may be applied to all storage mediums including a volatile memory. For example, the memory device 100 may include an unbuffered dual in-line memory module (UDIMM), a registered DIMM (RDIMM), a load reduced DIMM (LRDIMM), a nonvolatile DIMM (NVDIMM), etc. The above-described examples do not limit the embodiments of the inventive concepts.

Below, for convenience of description, it is assumed that the memory device 100 includes a single memory device. However, as described above, it will be understood that the embodiments of the inventive concepts may be applied to multiple storage devices.

The memory device 100 may communicate with the host 10. For example, the memory device 100 may communicate with the host 10 based on one or more of various wired communication protocols, such as a universal serial bus (BUS), a small computer system interface (SCSI), PCIe, a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). The above-described examples do not limit the embodiments of the inventive concepts.

The memory device 100 may perform a write operation, a read operation, etc. in response to a command and address CMD/ADDR received from the host 10. The read operation and the write operation of the memory device 100 will be described in more detail below.

In the case of the read operation, the host 10 provides the memory device 100 with an active command and information of a row address together with a command/address-dedicated C/A clock signal (not illustrated). After a reference time, the host 10 provides the memory device 100 with a read command and a column address together with the C/A clock signal (not illustrated). Thereafter, the memory device 100 provides the host 10 with data DATA that was requested.

In the case of the write operation, the host 10 may first provide the active command and the row address to the memory device 100 together with the C/A clock signal (not illustrated). After the reference time, the host 10 provides the memory device 100 with a write command and information of the column address together with the C/A clock signal (not illustrated). Thereafter, the host 10 provides the memory device 100 with the data DATA to be written to the memory device 100. When the memory device 100 operates in synchronization with a clock signal CLK, the memory device 100 may receive the data-dedicated clock signal CLK from the host 10 at the same time that the memory device 100 receives the data DATA from the host 10. The memory device 100 synchronizes the received data DATA with the data-dedicated clock signal CLK. The memory device 100 writes the received data DATA in a memory area corresponding to a specified address.

As shown in FIG. 1, the memory device 100 according to an embodiment of the inventive concepts may include an internal clock generator 130, a deserializer 140, a data comparator 170, and a clock controller 180. The internal clock generator 130 divides the clock signal CLK that is received from the host 10 and generates a plurality of internal clock signals (not illustrated), each of which has a different phase based on the divided clock signal. During a write operation of the memory device 100, the deserializer 140 deserializer the received data DATA based on the internal clock signals (not illustrated). The data comparator 170 compares the deserialized data with reference data.

After the memory device 100 enters a mode (e.g., a power-down mode) in which the host 10 stops providing the memory device 100 with the clock signal CLK, a point in time when the memory device 100 exits from the mode is referred to herein as an "initialization time point." Operations of a delay locked loop (DLL), the internal the clock generator 130, etc., which are included in the memory device 100 and which operate based on the clock signal CLK, are initialized after the initialization time point. The initialized internal clock generator 130 newly determines a clock dividing start time point of the clock signal CLK.

Here, the power-down mode is defined by Joint Electron Device Engineering Council (JEDEC) standard specification.

The clock dividing start time point of the internal clock generator 130 after the initialization may be different from the clock dividing start time point that was in use before the initialization time point. When the clock dividing start time point is changed, the internal clock generator 130 may generate internal clock signals (not illustrated) that are delayed as compared to the internal clock signals (not illustrated) that were generated before the initialization time point. The deserializer 140 may generate internal data by deserializing the received data DATA using the generated internal clock signals (not illustrated). If the clock dividing start time point after the initialization time point is delayed as compared to the clock dividing start time prior to the initialization start time point then the internal data may be deserialized out of order. The data comparator 170 compares the internal data to the reference data and provides the result of the comparison to the clock controller 180. The clock controller 180 may correct the clock dividing start time point of the internal clock generator 130 based on using the result of the comparison if the internal data is determined to be out of order.

For example, the clock signal CLK may be a data strobe signal that is provided from the host 10 during a write operation of the memory device 100 or provided to the host 10 during a read operation of the memory device 100. When the clock signal CLK is a data strobe signal, the clock signal CLK may have two-way directivity including a direction to the host 10 from the memory device 100 and a direction to the memory device 100 from the host 10. Alternatively, the clock signal CLK may be a dedicated data clock signal that is provided from the host 10 to the memory device 100. That is, the dedicated data clock signal is a clock signal that the memory device 100 always receives from the host 10, except that the memory device 100 does not operates in the case of a power-down mode. That is, when the clock signal CLK is the dedicated data clock signal, the clock signal CLK may have one-way directivity.

The memory device 100 according to an embodiment of the inventive concepts corrects the clock dividing start time point of the internal clock generator 130 by using a relationship between the data-dedicated clock signal CLK and the data DATA. That is, the memory device 100 corrects the clock dividing start time point of the internal clock generator 130 such that the clock signal CLK is independent of the C/A clock signal. Accordingly, the memory device 100 may control the clock dividing start time point of the internal clock generator 130 regardless of a timing margin between the C/A clock signal and the data-dedicated clock signal or a quality of the C/A clock signal.

Figure 2:
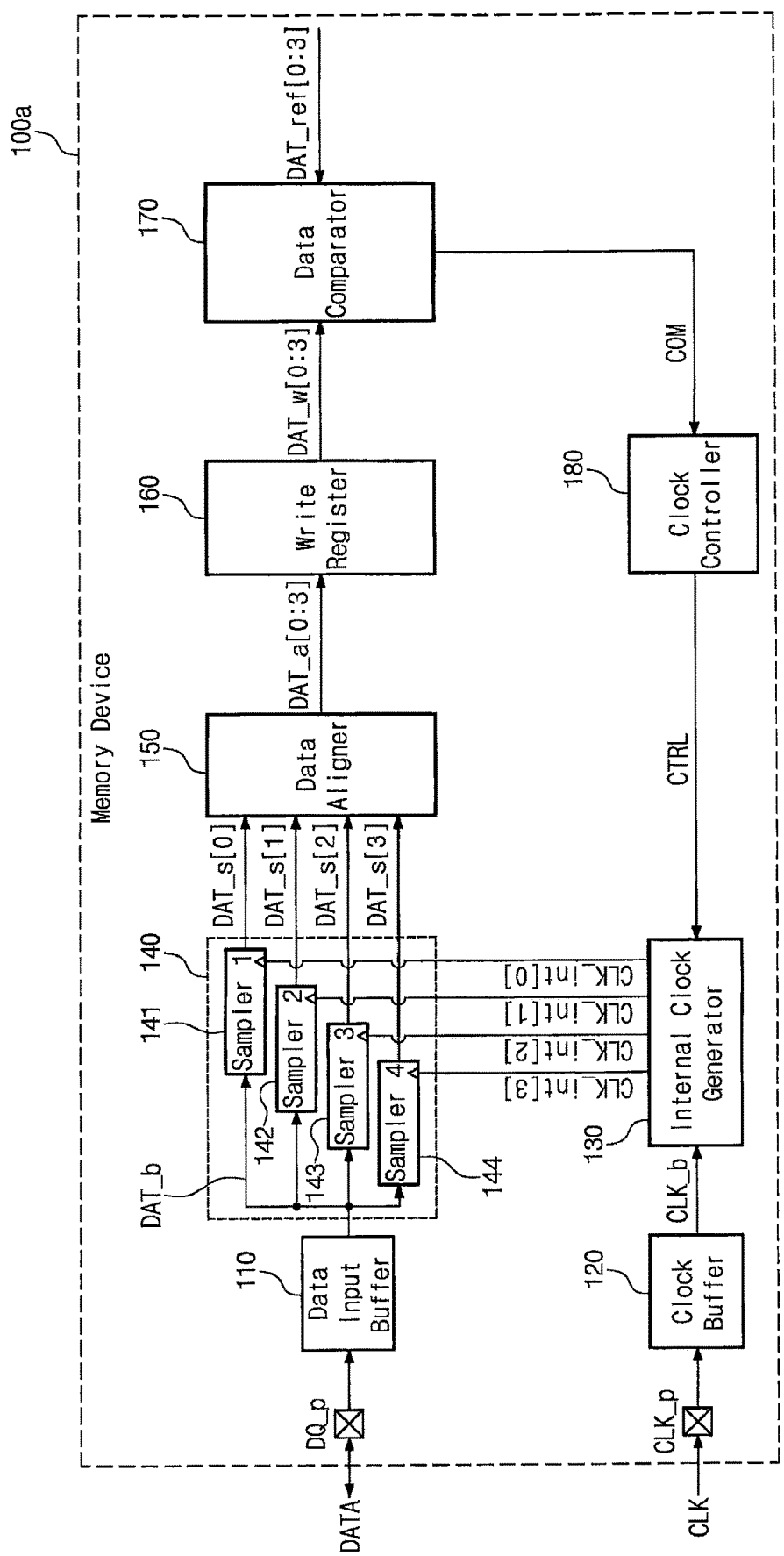
FIG. 2 is a block diagram illustrating an implementation of a memory device that is included in the memory system of FIG. 1 according to an embodiment of the inventive concepts.

FIG. 2 is a block diagram illustrating an embodiment 100a of the memory device 100 of FIG. 1. The block diagram of FIG. 2 will be described with reference to FIG. 1. Referring to FIG. 2, the memory device 100a may include a data input buffer 110, a clock buffer 120, the internal clock generator 130, the deserializer 140, a data aligner 150, a write register 160, the data comparator 170, and the clock controller 180.

The data input buffer 110 receives data DATA from the host 10 or provides the host 10 with the data DATA through a data pad DQ_p. The data input buffer 110 receives test data from the host 10 to perform a divided clock correction operation. For example, the test data may include data having successive bits. The data input buffer 110 generates buffer data DAT_b by buffering the received test data. The buffer data DAT_b is provided to the deserializer 140.

The clock buffer 120 receives a clock signal CLK from the host 10 through a clock pad CLK_p. The clock buffer 120 generates a buffer clock signal CLK_b by buffering the received clock signal CLK. The generated buffer clock signal CLK_b is provided to the internal clock generator 130.

The internal clock generator 130 generates first to fourth internal clock signals CLK_int[0:3] based on the buffer clock signal CLK_b. The internal clock generator 130 first generates a pre-clock signal (not illustrated) having half the frequency of the buffer clock signal CLK_b by dividing the frequency of the buffer clock signal CLK_b in half. The internal clock generator 130 generates the first to fourth internal clock signals CLK_int[0:3], each of which has a phase difference of 90 degrees, by differentiating a phase of the pre-clock signal (not illustrated). That is, the first internal clock signal CLK_int[0] may lead the second internal clock signal CLK_int[1] by a phase of 90 degrees. Similarly, the second internal clock signal CLK_int[1] may lead the third internal clock signal CLK_int[2] by a phase of 90 degrees, and the third internal clock signal CLK_int[2] may lead the fourth internal clock signal CLK_int[3] by a phase of 90 degrees.

Since the internal clock generator 130 divides the frequency of the buffer clock signal CLK_b in half, the clock dividing start time point of the internal clock generator 130 may be implemented with two time points that are different from each other. That is, when the internal clock generator 130 divides the frequency of the buffer clock signal CLK_b in half, the clock dividing start time point may include two time points, namely a rising edge and a falling edge of the buffer clock signal CLK_b. The internal clock generator 130 may change the clock dividing start time point to one of the above-mentioned two time points based on a control signal CTRL provided from the clock controller 180.

In the embodiment of FIG. 2, the internal clock generator 130 divides a frequency of the buffer clock signal CLK_b in half. Moreover, in the embodiment of FIG. 2, it is illustrated that the internal clock generator 130 generates the four first to fourth internal clock signals CLK_int[0:3], each of which has a phase difference of 90 degrees, based on the pre-clock signal (not illustrated). It will be appreciated, however, that the division ratio of the internal clock generator 130, the number of generated internal clock signals, and the phase difference between the internal clock signals may vary according to a double data rate (DDR) method of the memory device 100a. For example, in another embodiment, the internal clock generator 130 may generate eight internal clock signals each of which has a phase difference of 45 degrees by dividing a frequency of the buffer clock signal CLK_b in four.

The deserializer 140 may include first to fourth samplers 141 to 144. The deserializer 140 deserializes the buffered test data DAT_b using the first to fourth internal clock signals CLK_int[0:3]. The first sampler 141 generates first sampling data DAT_s[0] by sampling the buffer data DAT_b at an edge of the first internal clock signal CLK_int[0]. Similarly, the second to fourth samplers 142 to 144 sample the buffer data DAT_b at edges of the second to fourth internal clock signals CLK_int[1:3], respectively. The second to fourth samplers 142 to 144 generate second to fourth sampling data DATA_s[1:3], respectively.

The generated first to fourth sampling data DAT_s[0:3] are provided to the data aligner 150. For example, each of the first to fourth samplers 141 to 144 samples the buffer data DAT_b at a rising edge or a falling edge of a respective internal clock signal CLK_int[0:3]. Each of the first to fourth sampling data DAT_s[0:3] may have a phase difference of 90 degrees. That is, the first sampling data DAT_s[0] may lead the second sampling data DAT_s[1] by a phase of 90 degrees. Similarly, the second sampling data DAT_s[1] may lead the third sampling data DAT_s[2] by a phase of 90 degrees, and the third sampling data DAT_s[2] may lead the fourth sampling data DAT_s[3] by a phase of 90 degrees.

The data aligner 150 aligns the first to fourth sampling data DAT_s[0:3], each of which has a different phase, so as to be output at the same time point. The data aligner 150 outputs the aligned data as first to fourth alignment data DAT_a[0:3]. The output first to fourth alignment data DAT_a[0:3] are provided to the write register 160.

The write register 160 stores the first to fourth alignment data DAT_a[0:3]. The write register 160 also outputs the stored first to fourth alignment data DAT_a[0:3] as first to fourth write data DAT_w[0:3]. The output first to fourth write data DAT_w[0:3] are provided to the data comparator 170. Although not illustrated in FIG. 2, the first to fourth write data DAT_w[0:3] may be provided to a core circuit (not illustrated) of the memory device 100a to be stored in a memory cell (not illustrated) of the memory device 100a.

The data comparator 170 compares the first to fourth write data DAT_w[0:3] with first to fourth reference data DAT_ref[0:3] for each bit, which corresponds to each other, and outputs the compared result COM. The compared result COM is provided to the clock controller 180. The compared result COM may be implemented, for example, with a code including a plurality of bits or with a single signal. When the first to fourth internal clock signals CLK_int[0:3] are divided normally, the first to fourth reference data DATA_ref[0:3] may include the same data as the first to fourth write data DAT_w[0:3] that are generated through the deserializer 140, the data aligner 150, and the write register 160. The reference data DAT_ref[0:3] may be provided from the host 10.

The clock controller 180 generates the control signal CTRL based on the compared result COM. The clock controller 180 determines the clock dividing start time point of the internal clock generator 130 in response to the control signal CTRL. In the embodiment of FIG. 2, since the above-described clock dividing start time point includes two time points, the control signal CTRL may be implemented with a single signal. However, as described above, in other embodiments, the internal clock generator 130 may divide the frequency of the buffer clock signal CLK_b by a number other than two. For example, if the internal clock generator 130 divides the frequency of the buffer clock signal CLK_b by four, the clock dividing start time point may include four time points, for example, a rising edge time point and a falling edge time point of a first clock period of the buffer clock signal CLK_b and a rising edge time point and a falling edge time point of a second clock period thereof. When the clock dividing start time point includes four time points, the control signal CTRL may be implemented to include a code of 2 bits.

The divided clock correction operation of the memory device 100a will be described with reference to the flowchart of FIG. 3. An operation, in which the clock dividing start time point of the internal clock generator 130 is corrected by the clock controller 180, and an operation of the deserializer 140 based on an operation of correcting the clock dividing start time point will be described with reference to FIGS. 4 and 5.

Figure 3:
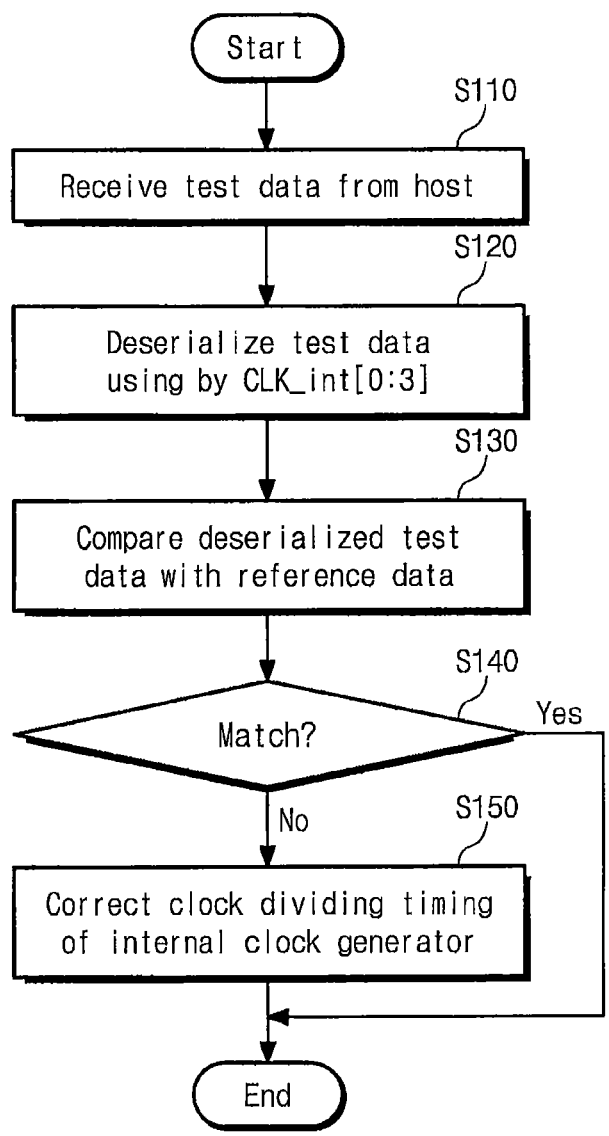
FIG. 3 is a flowchart describing operation of the memory device of FIG. 2.

FIG. 3 is a flowchart describing operation of the memory device of FIG. 2. The flowchart of FIG. 3 will be described with reference to FIGS. 1 and 2. Referring to FIG. 3, the memory device 100a may correct a clock dividing start time point of the internal clock generator 130.

In operation S110, the memory device 100a receives test data from the host 10 and buffers the test data. In operation S120, the deserializer 140 generates first to fourth sampling data DAT_s[0:3] by deserializing the buffered test data using the first to fourth internal clock signals CLK_int[0:3] to generate first to fourth sampling data DAT_s[0:3]. The generated first to fourth sampling data DAT_s[0:3] are aligned by the data aligner 150 and the write register 160, and the aligned data are output as first to fourth write data DAT_w [0:3].

In operation S130, the data comparator 170 compares the output first to fourth write data DAT_w[0:3] with first to fourth reference data DAT_ref[0:3], respectively. The data comparator 170 provides the result of the comparison COM to the clock controller 180. In operation S140, the clock controller 180 determines whether the first to fourth write data DAT_w[0:3] are the same as the first to fourth reference data DAT_ref[0:3], based on the compared result COM. If the first to fourth write data DAT_w[0:3] are the same as the first to fourth reference data DAT_ref[0:3] (Yes direction), the clock controller 180 maintains the previous control signal CTRL, and the internal clock generator 130 maintains the clock dividing start time point in operation S110 to operation S130. If the first to fourth write data DAT_w[0:3] are not the same as the first to fourth reference data DAT_ref[0:3] (No direction), the memory device 100a performs operation S150.

In operation S150, the clock controller 180 corrects the clock dividing start time point of the internal clock generator 130 based on the compared result COM. For example, the clock controller 180 may correct the clock dividing start time point by one period of a clock signal CLK. An operation of correcting the clock dividing start time point of the internal clock generator 130 will be described in greater detail with reference to FIGS. 4 and 5.

Figure 4:
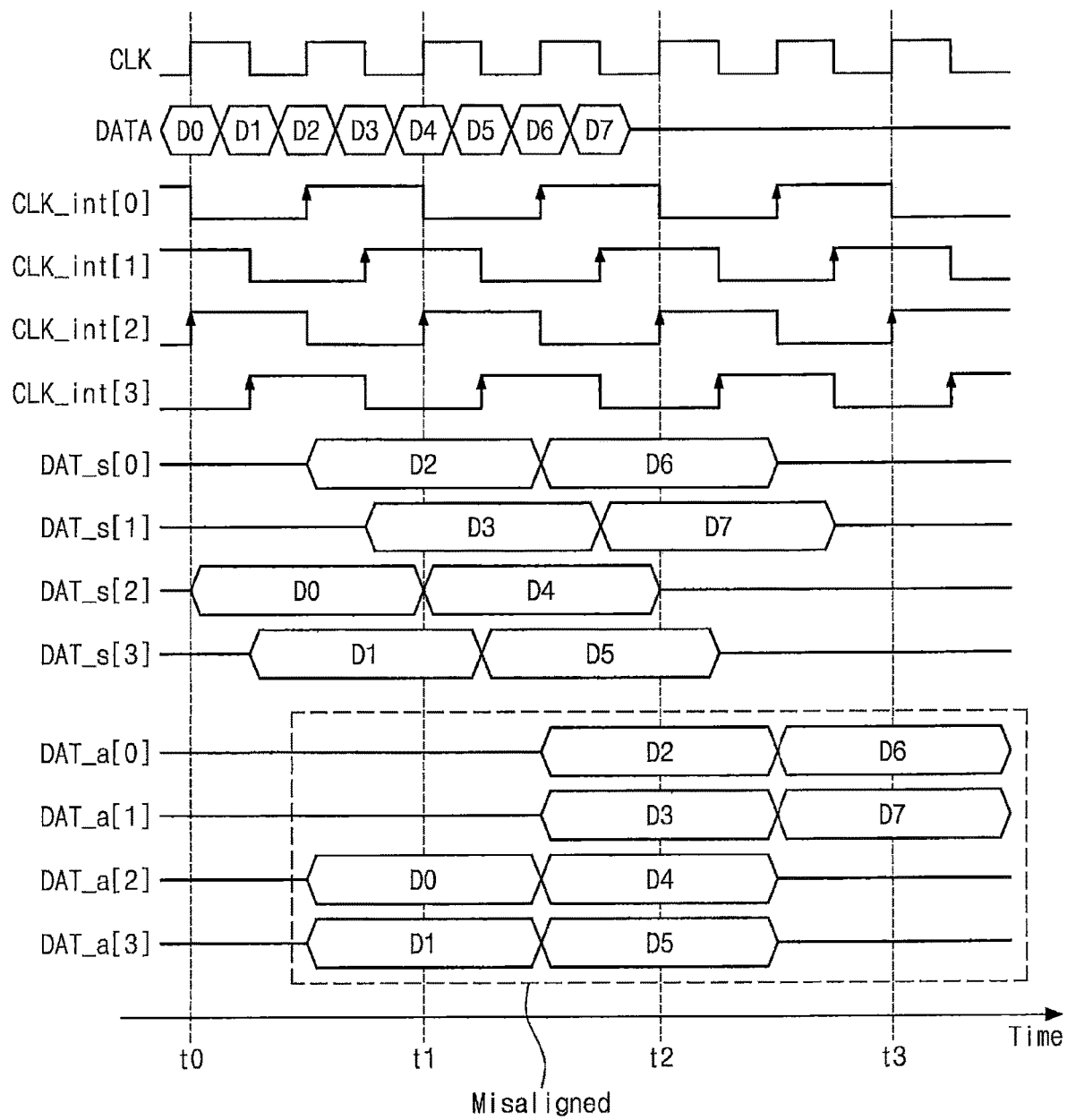
FIG. 4 is a timing diagram illustrating a data deserialization process of the memory device of FIG. 2.

FIG. 4 is a timing diagram illustrating a data deserialization process of the memory device of FIG. 2. The timing diagram of FIG. 4 will be described with reference to FIGS. 1 and 2. Referring to FIG. 4, there are illustrated first to fourth alignment data DAT_a[0:3] that are output when a clock dividing start time point of the internal clock generator 130 is delayed by one period of a clock signal CLK compared to the clock dividing start time point before the initialization time point. As described above, the frequency of clock signal CLK is divided in half by the internal clock generator 130. Accordingly, each of first to fourth internal clock signals CLK_int[0:3] operates at half of a frequency of the clock signal CLK.

From time t0 to time t1, the first to fourth samplers 141 to 144 of the deserializer 140 sample the first to fourth data D0 to D3 using the first to fourth internal clock signals CLKint[0:3], respectively. The first data D0 is sampled using the third internal clock signal CLK_int[2]. Next, the sampled first data D0 is output as third sampling data DAT_s[2]. The second data D1 is sampled using the fourth internal clock signal CLK_int[3], and the sampled second data D1 is output as fourth sampling data DAT_s[3]. The third data D2 is sampled using the first internal clock signal CLK_int[0], and the fourth data D3 is sampled using the second internal clock signal CLK_int[1]. The sampled third and fourth data D2 and D3 are output as first and second sampling data DAT_s[0:1], respectively.

Next, the data aligner 150 aligns a mid-point of each of the third and fourth sampling data DAT_s[2:3] such that a mid-point of each of the third and fourth sampling data DAT_s[2:3] is placed at time t1, and outputs the aligned pieces of data as the third and fourth alignment data DAT_a[2:3], respectively. The third and fourth alignment data DAT_a[2:3] may include the first and second data D0 and D1, respectively. Thus, from time t0 to time t1, the sampled third and fourth data D2 and D3 are aligned at time t2.

From time t1 to time t2, the first to fourth samplers 141 to 144 of the deserializer 140 sample fifth to eighth data D4 to D7 using the first to fourth internal clock signals CLKint[0:3], respectively. As in the operation from time t) to time t1, from time t1 to time t2, the fifth to eighth data D4 to D7 that are respectively sampled by the first to fourth samplers 141 to 144 are sequentially output as the third sampling data DAT_s[2], the fourth sampling data DAT_s[3], the first sampling data DAT_s[0], and the second sampling data DAT_s[1], respectively. Next, the data aligner 150 aligns a mid-point of each of the first to fourth sampling data DAT_s[0:3] such that a mid-point of each of the first to fourth sampling data DAT_s[0:3] is placed at time t2 and outputs the aligned pieces of data as the first to fourth alignment data DAT_a[0:4]. The first to fourth alignment data DAT_a[0:3] may include third to sixth data D2 to D5, respectively. The seventh and eighth data D6 and D7 sampled from time t2 to time t3 are aligned at time t3.

From time t2 to time t3, the data aligner 150 aligns a mid-point of each of the first and second sampling data DAT_s[0:1] such that a mid-point of each of the first and second sampling data DAT_s[0:1] is placed at time t3, and outputs the aligned pieces of data as the first and second alignment data DAT_a[0:1], respectively. The first and second alignment data DAT_a[0:1] may include the seventh to eighth data D6 and D7, respectively. As a result, when the clock dividing start time point of the internal clock generator 130 is delayed by one period of the clock signal CLK, the sampled and aligned first to eighth data D0 to D7 are not accurately aligned from time t1 to time t3 (i.e., they are aligned out of order).

Figure 5:
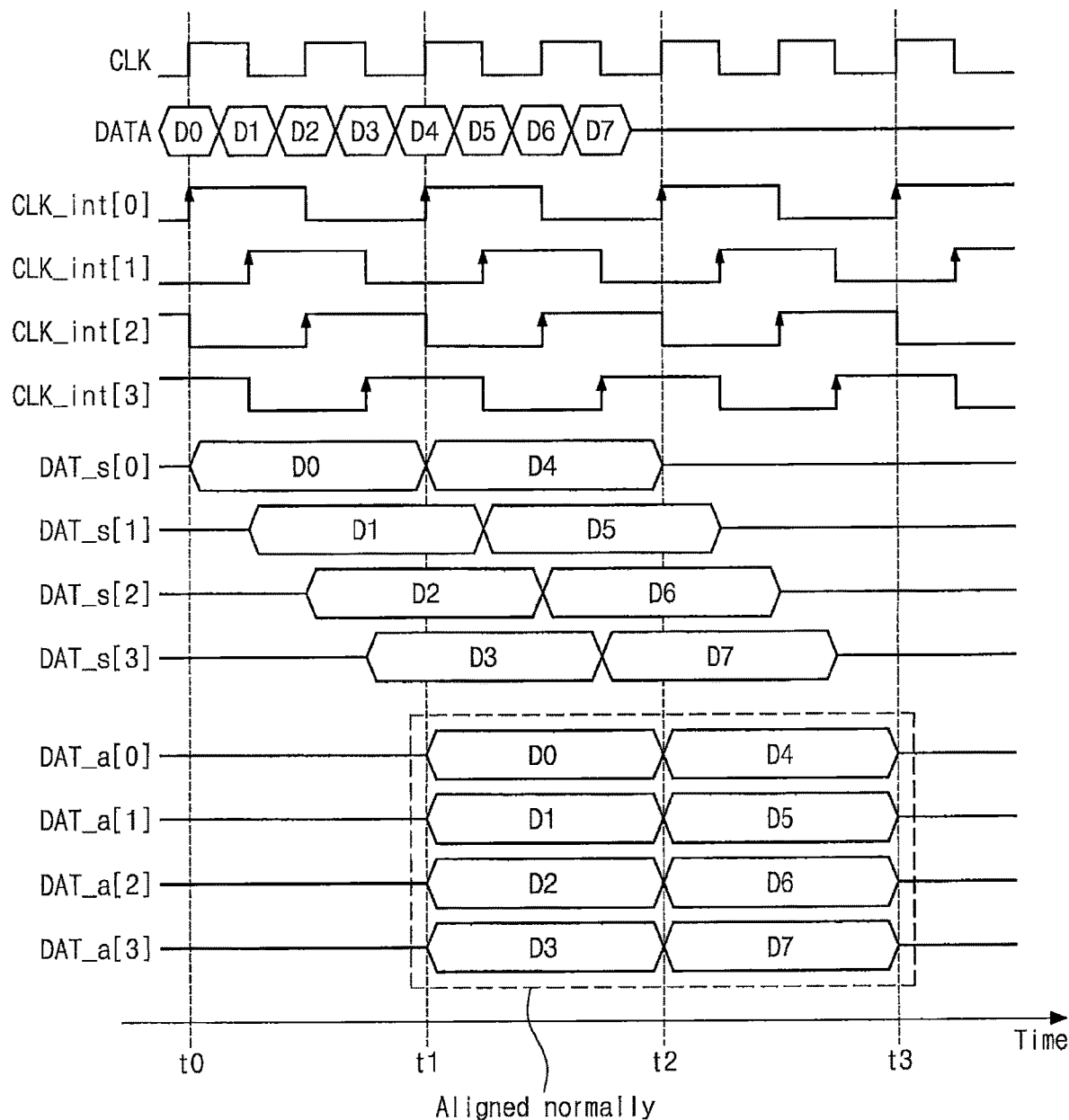
FIG. 5 is a timing diagram illustrating a data deserialization process if the memory device of FIG. 2 operates according to the divided clock correction method of FIG. 3.

FIG. 5 is a timing diagram illustrating a data deserialization process if the memory device of FIG. 2 operates according to the divided clock correction method of FIG. 3. The timing diagram of FIG. 5 will be described with reference to FIGS. 1 to 4. As described above, each of first to fourth internal clock signals CLK_int[0:3] operates at half of a frequency of the clock signal CLK.

When the sampled and aligned first to eighth data D0 to, D7 are misaligned, as illustrated in FIG. 4, a clock dividing start time point of the internal clock generator 130 may be is delayed by one period of the clock signal CLK or may be moved up by one period of the clock signal CLK, in response to a control signal CTRL generated by the data comparator 170 and the clock controller 180. This is shown with reference to FIG. 5, which illustrates the first to fourth alignment data DAT_a[0:3] that are output when the clock dividing start time point of the internal clock generator 130 is corrected.

From time t0 to time t1, the first to fourth samplers 141 to 144 of the deserializer 140 sample the first to fourth data D0 to D3 using the first to fourth internal clock signals CLK_int[0:3], respectively. Compared with the time period from time t0 to time t1 of FIG. 4, the sampled first to fourth data D0 to D3 are sequentially output as first to fourth sampling data DAT_s[0:3].

From time t1 to time t2, the data aligner 150 aligns a start point of each of the first to fourth sampling data DAT_s[0:3] such that the start point of each of the first to fourth sampling data DAT_s[0:3] is placed at time t1 and outputs the aligned pieces of data as the first to fourth alignment data DAT_a[0:3], respectively. The first to fourth alignment data DAT_a[0:3] may include the first to fourth data D0 to D3, respectively.

In addition, the first to fourth samplers 141 to 144 of the deserializer 140 sample the fifth to eighth data D4 to D7 using the first to fourth internal clock signals CLKint[0:3], respectively. The sampled fifth to eighth data D4 to D7 are sequentially output as first to fourth sampling data DAT_s[0:3], respectively.

From time t2 to time t3, the data aligner 150 aligns the start point of each of the first to fourth sampling data DAT_s[0:3] such that the start point of each of the first to fourth sampling data DAT_s[0:3] is placed at time t2, and outputs the aligned pieces of data as the first to fourth alignment data DAT_a[0:3], respectively. The first to fourth alignment data DAT_a[0:3] may include the fifth to eighth data D4 to D7, respectively.

In FIG. 5, the clock dividing start time point is corrected by one period of the clock signal CLK. As a result, the sampled and aligned first to eighth data D0 to D7 are accurately aligned from time t1 to time t3, which was not the case in the example of FIG. 4.

Figure 6:
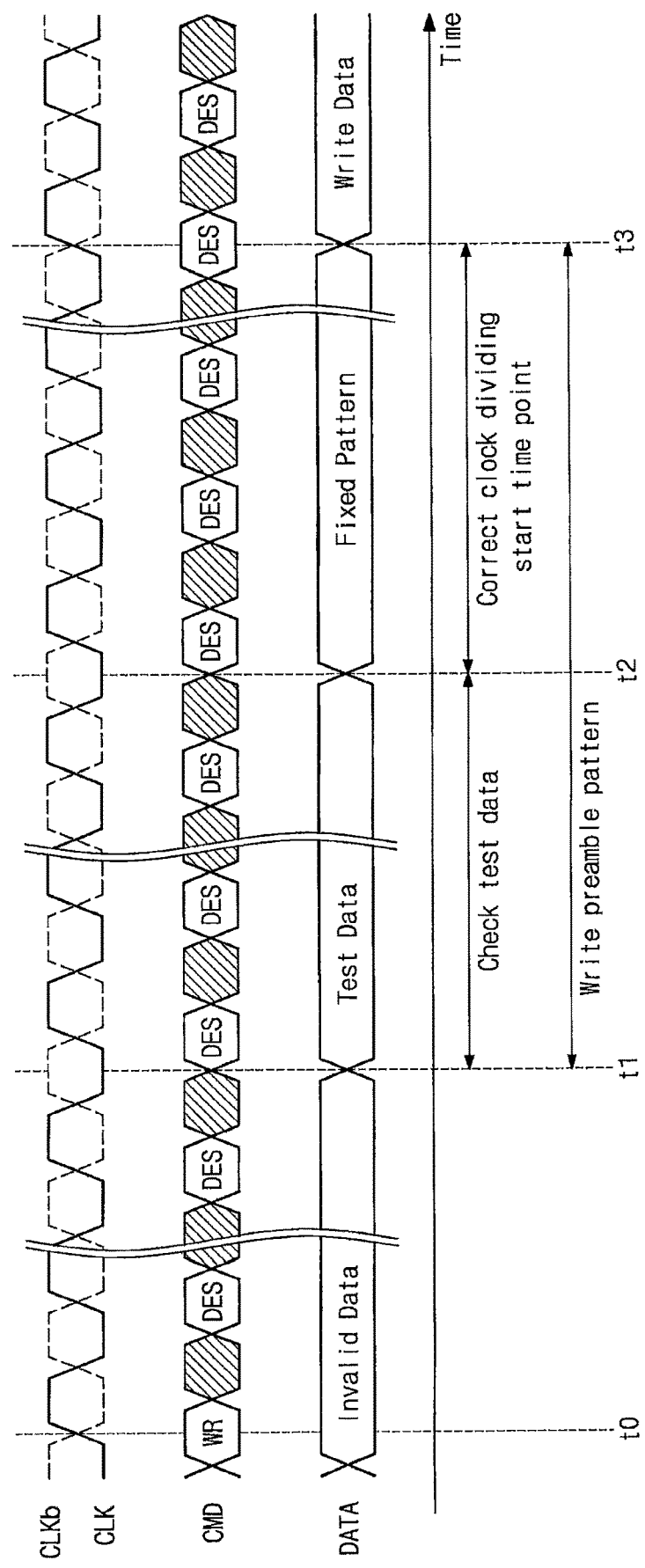
FIGS. 6 and 7 are timing diagrams illustrating a method in which the memory device of FIG. 2 receives test data according to an embodiment of the inventive concepts.
Figure 7:
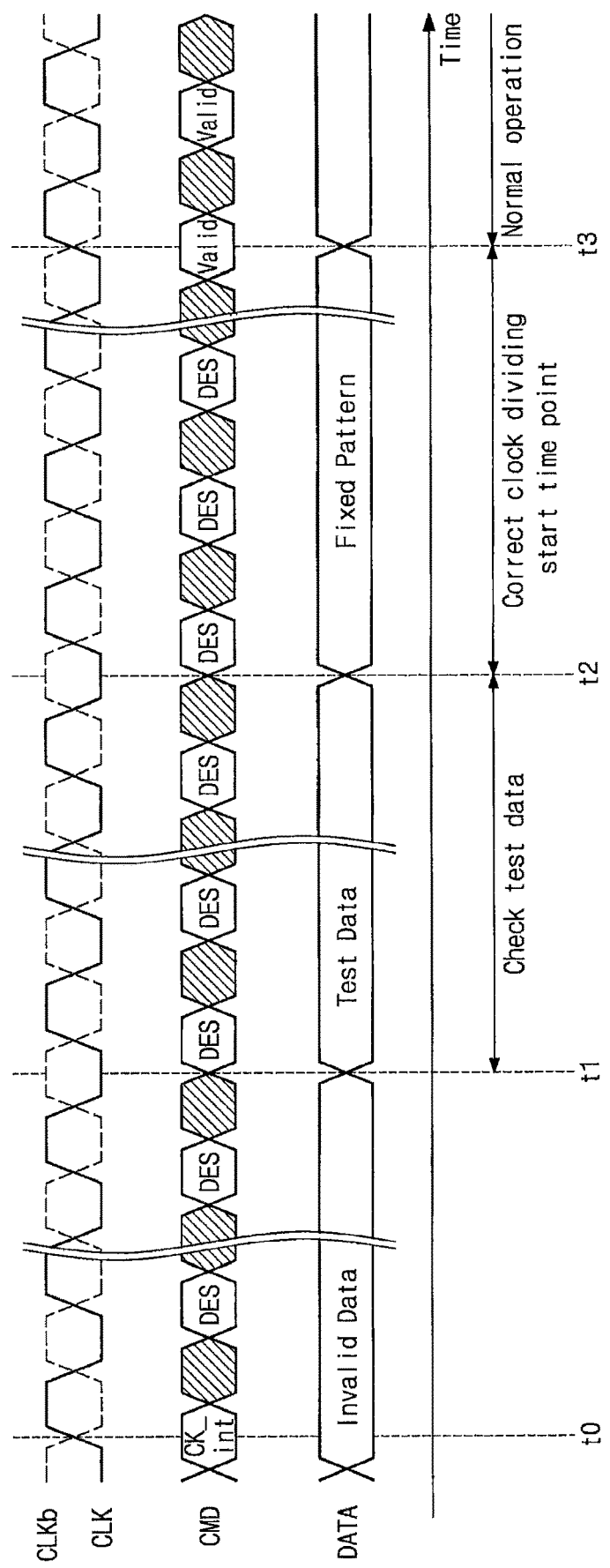

FIGS. 6 and 7 are timing diagrams illustrating a method in which the memory device of FIG. 2 receives test data according to an embodiment of the inventive concepts. The timing diagrams of FIGS. 6 and 7 will be described with reference to FIGS. 1 to 3. Each method in which the memory device 100a described with reference to FIGS. 6 and 7 receives the test data from the host 10 corresponds to operation S110 in FIG. 3.

Referring to FIG. 6, the memory device 100a may receive the test data from the host 10 in the form of a preamble signal of write data. The preamble signal is a signal that allows the memory device 100a to synchronize an input buffer (not illustrated), a clock buffer (not illustrated), etc. of the memory device 100a with a clock signal CLK before the memory device 100a receives the write data from the host 10. Accordingly, the preamble signal is provided from the host 10 before the memory device 100a receives the write data from the host 10.

At time t0, the memory device 100a receives a write command WR from the host 10. Generally, the host 10 provides the write command WR to the memory device 100a and provides the write data to the memory device 100a after a reference time. Here, it is assumed that the above-mentioned reference time corresponds to a time period from time t0 to time t3. From time t0 to time t1, the memory device 100a receives invalid data from the host 10. For example, the invalid data may be data in the form of a voltage that is fixed to a specific voltage to reduce a power consumption of the memory device 100a. The fixed voltage may vary according to at least one driving type or ODT type of the host 10 and the memory device 100a.

From time t1 to time t2, the memory device 100a receives the test data from the host 10. From time t1 to time t2, the memory device 100a may perform operation S120 to operation S140 illustrated in FIG. 3. That is, the deserializer 140 of the memory device 100a deserializes the received test data, and the data comparator 170 compares the deserialized data with reference data. In addition, the clock controller 180 determines whether to correct a clock dividing start time point of the internal clock generator 130, based on the compared result.

From time t2 to time t3, the memory device 100a receives a fixed pattern from the host 10. For example, the fixed pattern may include a data pattern of a voltage that is fixed to a specific voltage to reduce the power consumption of memory device 100a. The fixed voltage may vary according to at least one driving type or ODT type of the host 10 and the memory device 100a. From time t2 to time t3, the memory device 100a may perform operation S150 illustrated in FIG. 3. That is, the memory device 100a may correct the clock dividing start time point of the internal clock generator 130 if the result of the comparison indicates that such a correction is necessary. After time t3, the memory device 100a receives the write data. Next, the memory device 100a performs a write operation using the first to fourth internal clock signals CLK_int[0:3] that are generated by the internal clock generator 130, a clock dividing start time point of each of which has been corrected if such correction was necessary.

From time t1 to time t3, a form of the preamble signal that the memory device 100a receives from the host 10 is referred to as a "write preamble pattern." The write preamble pattern may include the above-mentioned test data and the above-mentioned fixed pattern.

In summary, from time t1 to time t3, the memory device 100a receives the test data from the host 10 and corrects the clock dividing start time point of the internal clock generator 130, if necessary, based on the comparison of the internal data to the reference data. Since the write operation of the memory device 100a is performed using the first to fourth internal clock signals CLK_int[0:3], the divided clock correction operation of the memory device 100a needs to be completed before the memory device 100a performs the write operation. That is, before the write data is provided from the host 10, a time period that is not less than a time period from time t1 to time t3 may be provided to guarantee that any correction of the clock dividing start time point of the internal clock generator 130 may be performed. Accordingly, when the time period that is not less than the time period from time t1 to time t3 is not guaranteed because write commands WRs are successively received, the memory device 100a may not perform a correction operation of the clock dividing start time point. As a result, when the write commands WRs are received at specified time intervals such that the time period from time t1 to time t3 is guaranteed, the memory device 100a may perform the correction operation of the clock dividing start time point in response to the test data received from the host 10, based on the embodiment of FIG. 6.

Referring to FIG. 7, when a clock initialization command CK_int is provided from the host 10, the memory device 100a may receive the test data from the host 10. The clock initialization command CK_int may be defined to be employed by a user.

At time t0, the memory device 100a receives the clock initialization command CK_int from the host 10. From time t0 to time t1, the memory device 100a receives invalid data from the host 10. From time t1 to time t2, the memory device 100a receives the test data from the host 10. As in the embodiment of FIG. 6, from time t1 to time t2, the deserializer 140 deserializes the received test data, and the data comparator 170 compares the deserialized data with the reference data. The clock controller 180 determines whether to correct the clock dividing start time point of the internal clock generator 130 based on the result of the comparison.

From time t2 to time t3, the memory device 100a receives the fixed pattern from the host 10. As in the embodiment of FIG. 6, from time t2 to time t3, the memory device 100a corrects the clock dividing start time point of the internal clock generator 130, if necessary, based on the determination made as to whether such a correction was necessary. At time t3, the memory device 100a receives a valid command Valid from the host 10. For example, the valid command Valid may include a write command, a read command, etc. Then, the memory device 100a may perform the received valid command Valid by using the first to fourth internal clock signals CLK_int[0:3] that are generated by the internal clock generator 130, a clock dividing start time point of each of which is corrected.

Figure 8:
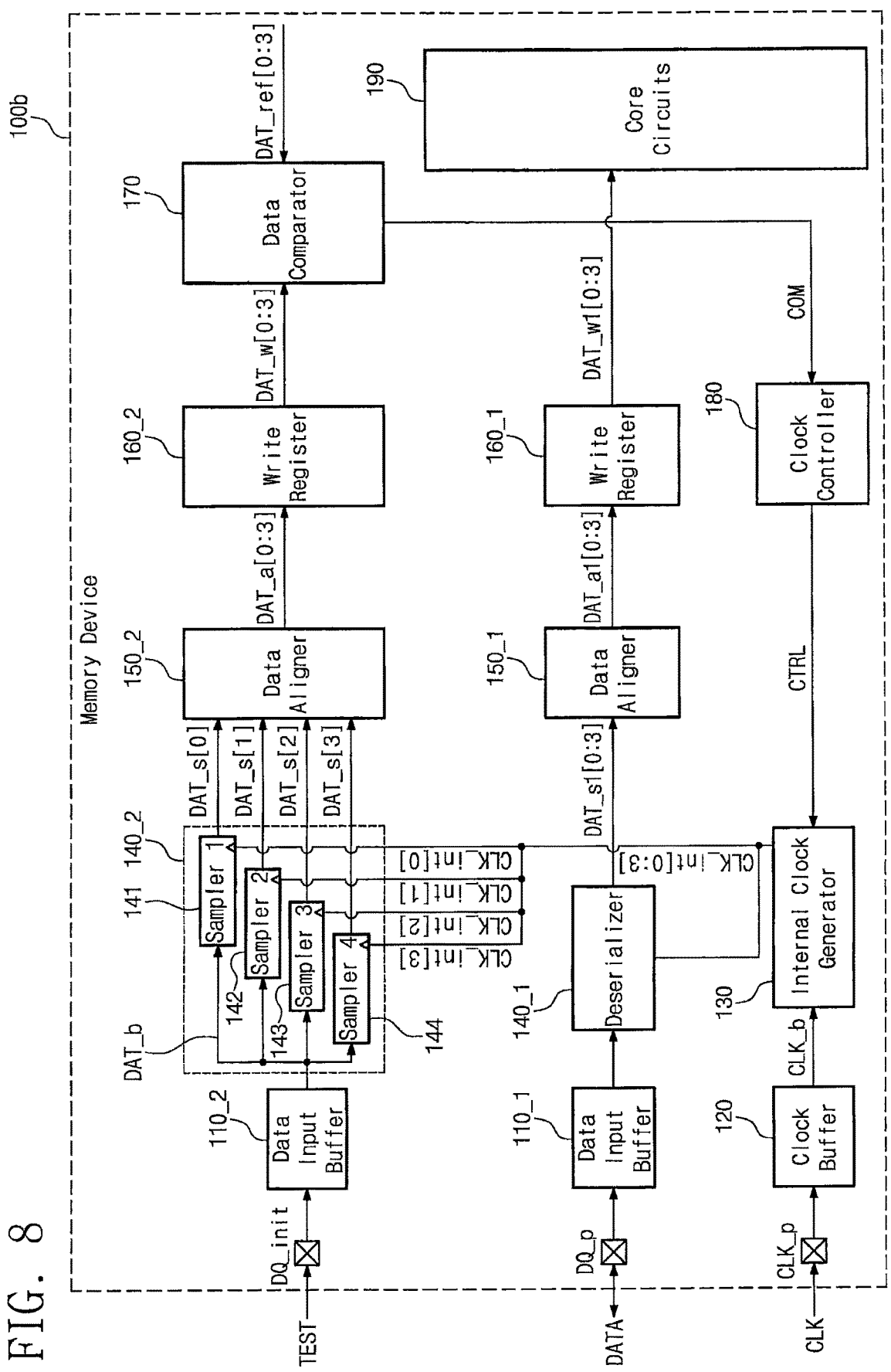
FIG. 8 is a block diagram illustrating another implementation of the memory device of FIG. 1 according to embodiments of the inventive concept.

FIG. 8 is a block diagram illustrating an implementation of the memory device included in the memory system of FIG. 1 according to another embodiment of the inventive concepts. The block diagram of FIG. 8 will be described with reference to FIG. 1. Referring to FIG. 8, a memory device 100b may include first and second data input buffers 110_1 and 110_2, a clock buffer 120, first and second deserializers 140_1 and 140_2, first and second data aligners 150_1 and 150_2, first and second write registers 160_1 and 160_2, a data comparator 170, a clock controller 180, and core circuits 190.

As is readily apparent, the memory device 100b of FIG. 8 includes a number of additional circuits as compared to the memory device 100a of FIG. 2. The additional circuits included in the memory device 100b are an initialization pad DQ_init for receiving test data TEST, the second data input buffer 110_2, the second deserializer 140_2, the second data aligner 150_2, the second write register 160_2, and the core circuits 190. It will be appreciated that the memory device 100a of FIG. 2 includes core circuits, even though they are not depicted in FIG. 2.

The memory device 100b receives the test data TEST from the host 10 through the initialization pad DQ_init. For example, the initialization pad DQ_init may be a dedicated pad for receiving the test data TEST from the host 10. Alternatively, the initialization pad DQ_init may be a pad that is used to receive another signal when the memory device 100b does not perform a divided clock correction operation, and this pad is then reused for receiving the test data TEST from the host 10 when the memory device 100b performs the divided clock correction operation. For example, the initialization pad DQ_init may include a data bus inversion (DBI) pad, an error detection code (EDC) pad, etc.

The second deserializer 140_2 generates first to fourth sampling data DAT_s[0:3] by deserializing the received test data TEST. The operations of generating the first to fourth alignment data DAT_a[0:3] and first to fourth write data DAT_w[0:3] based on the first to fourth sampling data DAT_s[0:3] using the second data aligner 150_2 and the second write register 160_2 and the operation of correcting a clock dividing start time point of the internal clock generator 130 using the data comparator 170 and the clock controller 180 are the same as those described with reference to FIG. 2, and hence further description thereof will not be repeated here.

The memory device 100b receives data DATA from the host 10 through a data pad DQ_p. Compared with the memory device 100a of FIG. 2, the memory device 100b does not receive test data TEST through the data pad DQ_p. The memory device 100b generates first to fourth write data DAT_w1[0:3] by deserializing and aligning the data DATA received from the host 10 through the first data input buffer 110_1, using the first deserializer 140_1, the data aligner 150_1, and the first write register 160_1. The first to fourth write data DAT_w1[0:3] is provided to the core circuits 190.

For example, the core circuits 190 may include a sense amplifier (not illustrated), a memory cell array (not illustrated), etc.

A configuration and an operation of the memory device 100b are the same as those described with reference to FIG. 2 other than as described above. The operation of the memory device 100b in FIG. 8 will be described with reference to FIG. 9.

Figure 9:
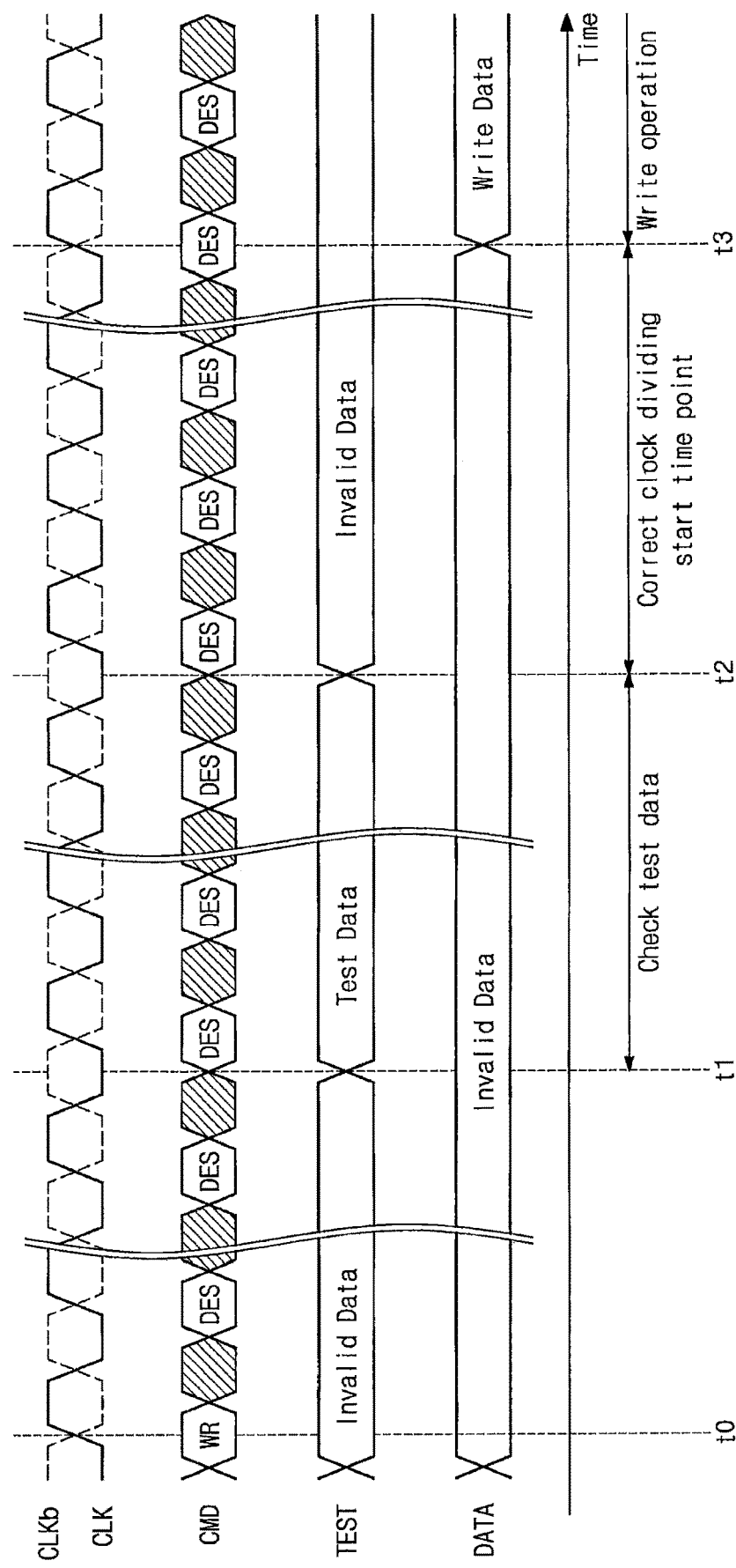
FIG. 9 is a timing diagram illustrating a method in which the memory device of FIG. 8 receives test data according to an embodiment of the inventive concepts.

FIG. 9 is a timing diagram illustrating a method in which the memory device of FIG. 8 receives test data. The timing diagram of FIG. 9 will be described with reference to FIGS. 1, 3, and 8. When a write command WR is provided from the host 10, the memory device 100b may receive test data TEST through the initialization pad DQ_init.

At time t0, the memory device 100b receives the write command WR from the host 10. From time t0 to time t3, the memory device 100b receives invalid data from the host 10 through pad DQ_p, and from time t0 to t1 the memory device 100b receives invalid data from the host 10 through the initialization pad DQ_init. From time t1 to time t2, the memory device 100b receives the test data TEST from the host 10 through the initialization pad DQ_init. As described above with reference to FIG. 6, from time t1 to time t2 the deserializer (here deserializer 140_2) deserializes the received test data TEST, and the data comparator 170 compares the deserialized data with reference data. The clock controller 180 determines whether to correct the clock dividing start time point of the internal clock generator 130 based on the result of the comparison.

From time t2 to time t3, the memory device 100b receives invalid data from the host 10 through the initialization pad DQ_init and through data pad DQ_p. As in an operation from time t2 to time t3 of FIG. 6, the memory device 100b corrects the clock dividing start time point of the internal clock generator 130 if it was determined that such a correction was necessary based on the comparison of the test data TEST received between time t1 to time t2 with the reference data.

After time t3, the memory device 100b operates using first to fourth internal clock signals CLK_int[0:3], a clock dividing start time point each of which has been corrected, if such correction was necessary, and which are generated by the internal clock generator 130. At time t3, the memory device 100b receives write data from the host 10. Next, the memory device 100b stores the write data in a memory cell at time t3 based on the write command WR received from the host 10 at time t0.

Figure 10:
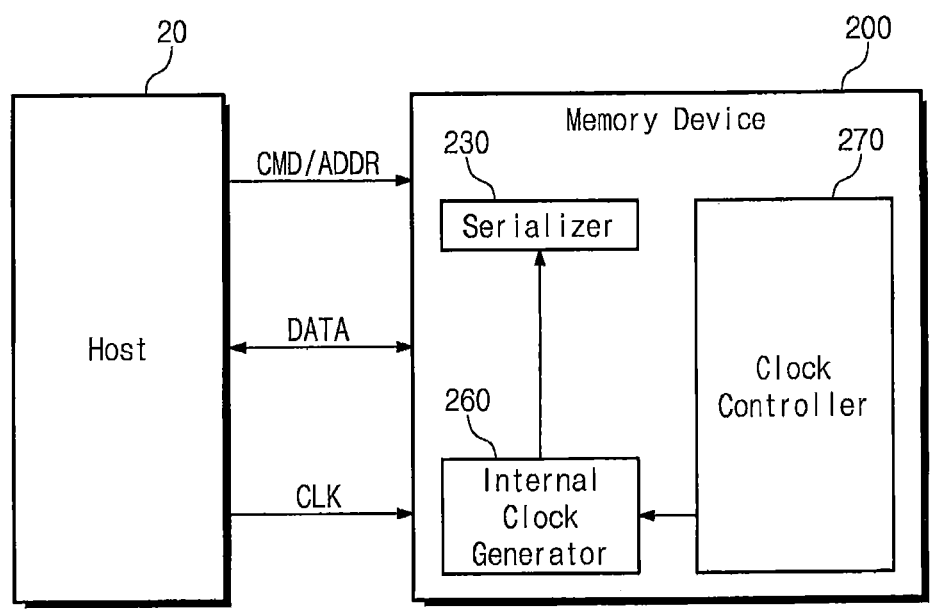
FIG. 10 is a block diagram illustrating a memory system according to another embodiment of the inventive concepts.

FIG. 10 is a block diagram illustrating a memory system 2 according to another embodiment of the inventive concepts. Referring to FIG. 10, the memory system 2 may include a host 20 and a memory device 200.

The host 20 may correct a clock dividing start time point by training the memory device 200. The host 20 provides a training pattern to the memory device 200 before the host 20 trains the memory device 200. The memory device 200 stores the training pattern. Next, the host 20 provides the memory device 200 with a command for reading the training pattern. The host 20 determines whether an output time point of the training pattern that is received from the memory device 200 is the same as an expected output time point for the training pattern. The host 20 determines whether to correct the clock dividing start time point of the memory device 200 based on the result of this determination. The host 20 provides a clock controller 270 of the memory device 200 with a control signal for correcting the clock dividing start time point. For example, the control signal may include a mode register set (MRS) code.

The memory device 200 may include a serializer 230, an internal clock generator 260, and the clock controller 270. The internal clock generator 260 divides a clock signal CLK received from the host 10 and generates a plurality of internal clock signals (not illustrated), each of which has a different phase, based on the clock signal CLK. The serializer 230 serializes the previously stored training pattern based on the plurality of internal clock signals (not illustrated) and provides the host 20 with the serialized training pattern. The clock controller 270 corrects the clock dividing start time point of the internal clock generator 260, if necessary, based on a control signal provided from the host 20.

Compared to the memory system 1 of FIG. 1, the memory system 2 of FIG. 10 determines at the host 20 whether to correct the clock dividing start time point of the internal clock generator 260, through the training.

Figure 11:
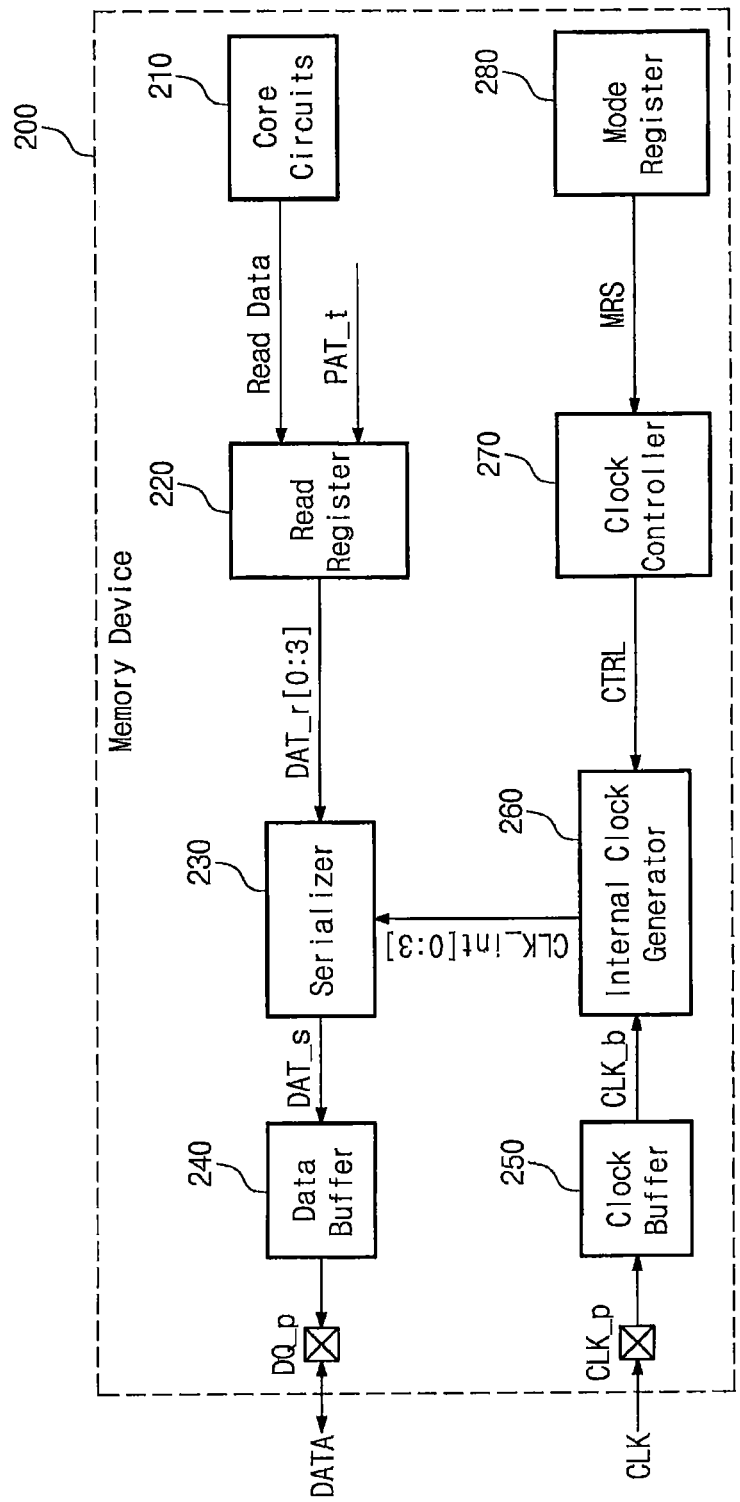
FIG. 11 is a block diagram illustrating an implementation of the memory device of FIG. 10 according to an embodiment of the inventive concepts.

FIG. 11 is a block diagram illustrating an implementation of the memory device 200 of FIG. 10. The block diagram of FIG. 11 will be described with reference to FIG. 10. Referring to FIG. 11, the memory device 200 may include core circuits 210, a read register 220, the serializer 230, a data buffer 240, a clock buffer 250, the internal clock generator 260, the clock controller 270, and a mode register 280.

The core circuits 210 provide the read register 220 with read data Read Data based on a read command that is received from the host 20. For example, the core circuits 210 may include a sense amplifier (not illustrated), a memory cell array (not illustrated), etc.

The read register 220 may store a training pattern PAT_t. As described above, the training pattern PAT_t may be provided to the read register 220 from the host 20 before training of the memory device 200 is performed by the host 20. The read register 220 may also store the read data Read Data that is provided from the core circuits 210. The read register 220 outputs the training pattern PAT_t or the read data Read Data as first to fourth register data DAT_r[0:3] in response to a command from the host 20. Each of the first to fourth register data DAT_r[0:3] may have a phase difference of 90 degrees. That is, the first register data DAT_r[0] may lead the second register data DAT_R[1] by a phase of 90 degrees, the second register data DAT_r[1] may lead the third register data DAT_r[2] by a phase of 90 degrees, and the third register data DAT_r[2] may lead the fourth register data DAT_r[3] by a phase of 90 degrees.

The serializer 230 receives the first to fourth register data DAT_r[0:3] from the read register 220. The serializer 230 generates serial data DAT_s by serializing the first to fourth register data DAT_r[0:3] using first to fourth internal clock signals CLK_int[0:3]. The process by which the serial data DAT_s is generated by the serializer 230 will be described in detail below with reference to FIGS. 13 and 14. A data rate of the serial data DAT_s may be four times faster than a data rate of each of the first to fourth register data DAT_r[0:3].

As described above, a clock dividing start time point of the internal clock generator 260 after the initialization time point may be different from a clock dividing start time point before the initialization time point. The serializer 230 may generate the serial data DAT_s by serializing the first to fourth register data DAT_r[0:3] in an abnormal order using the first to fourth internal clock signals CLK_int[0:3], which are generated after the initialization time point. The host 20 receives the serial data DAT_s in the abnormal order. The time at which the serial data DAT_s is output to the host 20 will be delayed if the serial data DAT_s is in an abnormal order as compared to the time at which the serial data DAT_s will be output if the serial data DAT_s is output in a normal order. Accordingly, the host 20 may determine whether to correct the clock dividing start time point of the internal clock generator 260 based on an output time point of the serial data DAT_s and an expected output time point of the serial data DAT_s and provides the memory device 200 with the determined result in the form of an MRS command.

For example, the serial data DAT_s may comprise EDC (Error Detecting Code) hold pattern. In this case, the serial data DAT_s may be output through EDC pad instead of data pad DQ_p. EDC hold pattern may comprise repeated data pattern '1010'. The host 20 may determine whether to correct the clock dividing start time point of the internal clock generator 260 based on data rate or data pattern of received serial data DAT_s comprising EDC hold pattern. Additionally, serial data DAT_s may be output continuously without read command from host 20 or memory controller. According to JEDEC specification, data rate of EDC hold pattern may be changed by MRS code from host 20 or memory controller.

The data buffer 240 receives the serial data DAT_s from the serializer 230. The data buffer 240 buffers the serial data DAT_s and provide the host 20 with the buffered serial data DAT_s through a data pad DQ_p.

The clock buffer 250 receives a clock signal CLK from the host 20 through a clock pad CLK_p. The clock buffer 250 generates a buffer clock signal CLK_b by buffering the received clock signal CLK. The generated buffer clock signal CLK_b is provided to the internal clock generator 260. The internal clock generator 260 generates the first to fourth internal clock signals CLK_int[0:3] based on the buffer clock signal CLK_b. The configuration and operation of the clock buffer 250 and the internal clock generator 260 may be the same as the configuration and operation of the clock buffer 120 and the internal clock generator 130 that are described above with reference to FIG. 2. As described above, a division ratio of the internal clock generator 260, the number of generated internal clock signals, and a phase difference between the internal clock signals may vary according to a DDR method of the memory device 200.

The clock controller 270 generates a control signal CTRL based on a MRS code MRS that is provided from the host 20 and that is stored in the mode register 280. The control signal CTRL determines the clock dividing start time point of the internal clock generator 260. Except that the clock controller 270 generates the control signal CTRL based on the MRS code MRS, the clock controller 270 of FIG. 11 has the same configuration and operation as the clock controller 180 of FIG. 2.

The mode register 280 may store information that is provided from the host 20 regarding whether to correct the clock dividing start time point. For example, the information may be provided by the MRS command from the host 20. In this case, the information is stored in the mode register 280 in the form of the MRS code. The mode register 280 may provide the stored MRS code MRS to the internal clock controller 270. The clock controller 270 may instruct the internal clock generator 260 to correct the clock dividing start time point based on the MRS code MRS.

Figure 12:
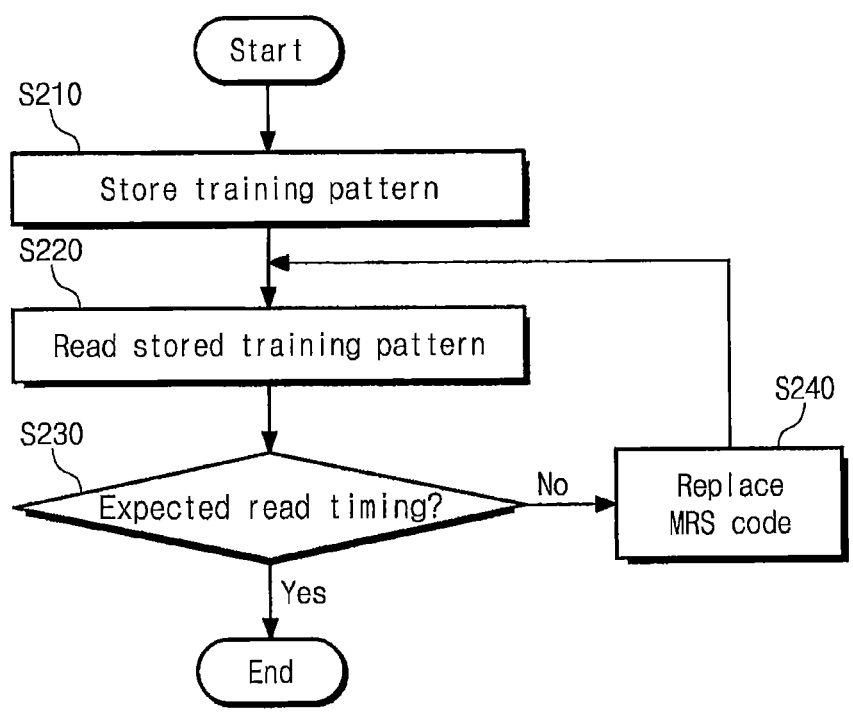
FIG. 12 is a flowchart describing operation of the memory device of FIG. 11.

FIG. 12 is a flowchart describing a method of operating the memory device of FIG. 11. The flowchart of FIG. 12 will be described with reference to FIGS. 10 and 11. Referring to FIG. 12, the memory device 200 may correct a clock dividing start time point of the internal clock generator 260.

In operation S210, the memory device 200 receives a training pattern from the host 20 and stores the received training pattern in the read register 220. Afterwards, in operation S220 to operation S240, the host 20 and the memory device 200 perform training for correcting a clock dividing start time point of the memory device 200. In operation S220, the memory device 200 serializes the stored training pattern and provides the host 20 with the serialized training pattern as serial data DAT_s in response to a training command from the host 20.

In operation S230, the host 20 determines whether an output time point of the serial data DAT_s provided from the memory device 200 is the same as an expected output time point of the serial data DAT_s. If the output time point of the serial data DAT_s is the same as the expected output time point of the serial data DAT_s (Yes direction), the host 20 provides an MRS command that allows the memory device 200 to maintain a previous clock dividing start time point, and the internal clock generator 260 maintains the previous clock dividing start time point. If the output time point of the serial data DAT_s is not the same as the expected output time point of the serial data DAT_s (No direction), the host 20 and the memory device 200 perform operation S240.

In operation S240, the host 20 provides the memory device 200 with an MRS command for correcting the clock dividing start time point of the internal clock generator 260. The mode register 280 of the memory device 200 replaces the previously stored MRS command with the MRS command provided from the host 20. Accordingly, the clock controller 270 and the internal clock generator 260 correct the clock dividing start time point based on the MRS code MRS provided by the mode register 280. An operation for correcting the clock dividing start time point of the internal clock generator 260 will be described in greater detail with reference to FIGS. 13 and 14.

Figure 13:
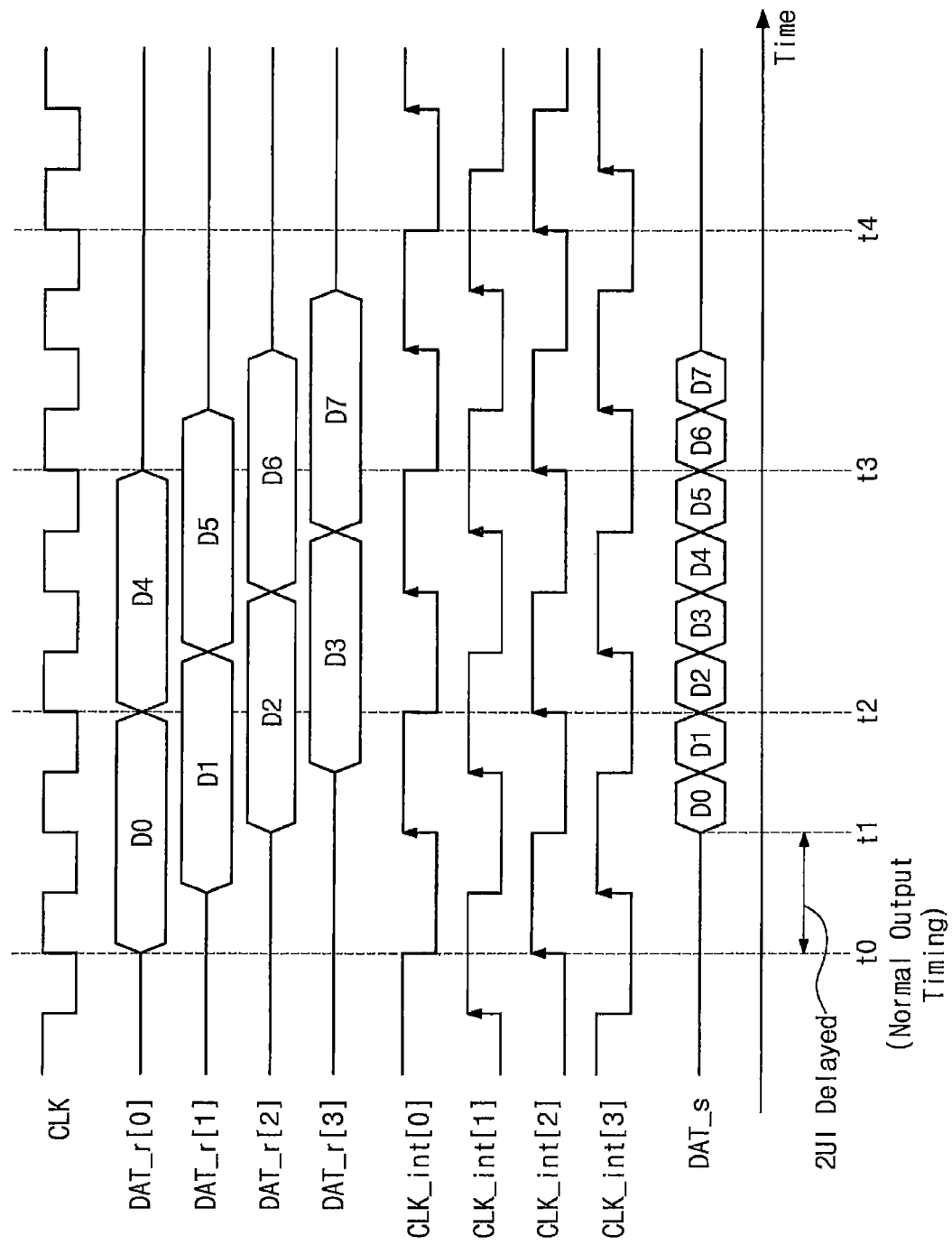
FIG. 13 is a timing diagram illustrating a data serialization process of the memory device of FIG. 11.

FIG. 13 is a timing diagram illustrating a data serialization process for the memory device of FIG. 11. The timing diagram of FIG. 13 will be described with reference to FIGS. 10 and 11. Referring to FIG. 13, serial data DAT_s is output when a clock dividing start time point of the internal clock generator 260 is delayed by one period of a clock signal CLK compared to the clock dividing start time point before initialization. As described above, a frequency of the clock signal CLK is divided in half by the internal clock generator 260. Accordingly, each of first to fourth internal clock signals CLK_int[0:3] operates at half of a frequency of the clock signal CLK.

From time t0 to time t2, the serializer 230 serializes first and second register data DAT_r[0:1] using the first and second internal clock signals CLK_int[0:1]. At time t1, first data D0 sampled at a rising edge of the first internal clock signal CLK_int[0] is output as serial data DAT_s. Next, second data D1 sampled at a rising edge of the second internal clock signal CLK_int[1] is output as serial data DAT_s. The serial data DAT_s is output with the serial data DAT_s delayed by one period of the clock signal CLK from time t0.

From time t2 to time t3, the serializer 230 serializes the first to fourth register data DAT_r[0:3] using the first to fourth internal clock signals CLK_int[0:3]. At time t2, second data D2 sampled at a rising edge of the third internal clock signal CLK_int[2] is output as serial data DAT_s, and fourth data D3 sampled at a rising edge of the fourth internal clock signal CLK_int[3] is output as serial data DAT_s. Next, fifth and sixth data D4 and D5 are respectively sampled at rising edges of the first and second internal clock signals CLK_int[0:1]. Each of fifth and sixth data D4 and D5 is also output as serial data DAT_s.

From time t3 to time t4, the serializer 230 serializes the third and fourth register data DAT_r[2:3] using the third and fourth internal clock signal CLK_int[2:3], respectively.

After time t3, the seventh and eighth data D6 and D7 are output as serial data DAT_s. Accordingly, the first to eighth data D0 to D7 are sequentially output as serial data DAT_s from a time point that is delayed by one period of the clock signal CLK compared to time t0.

Figure 14:
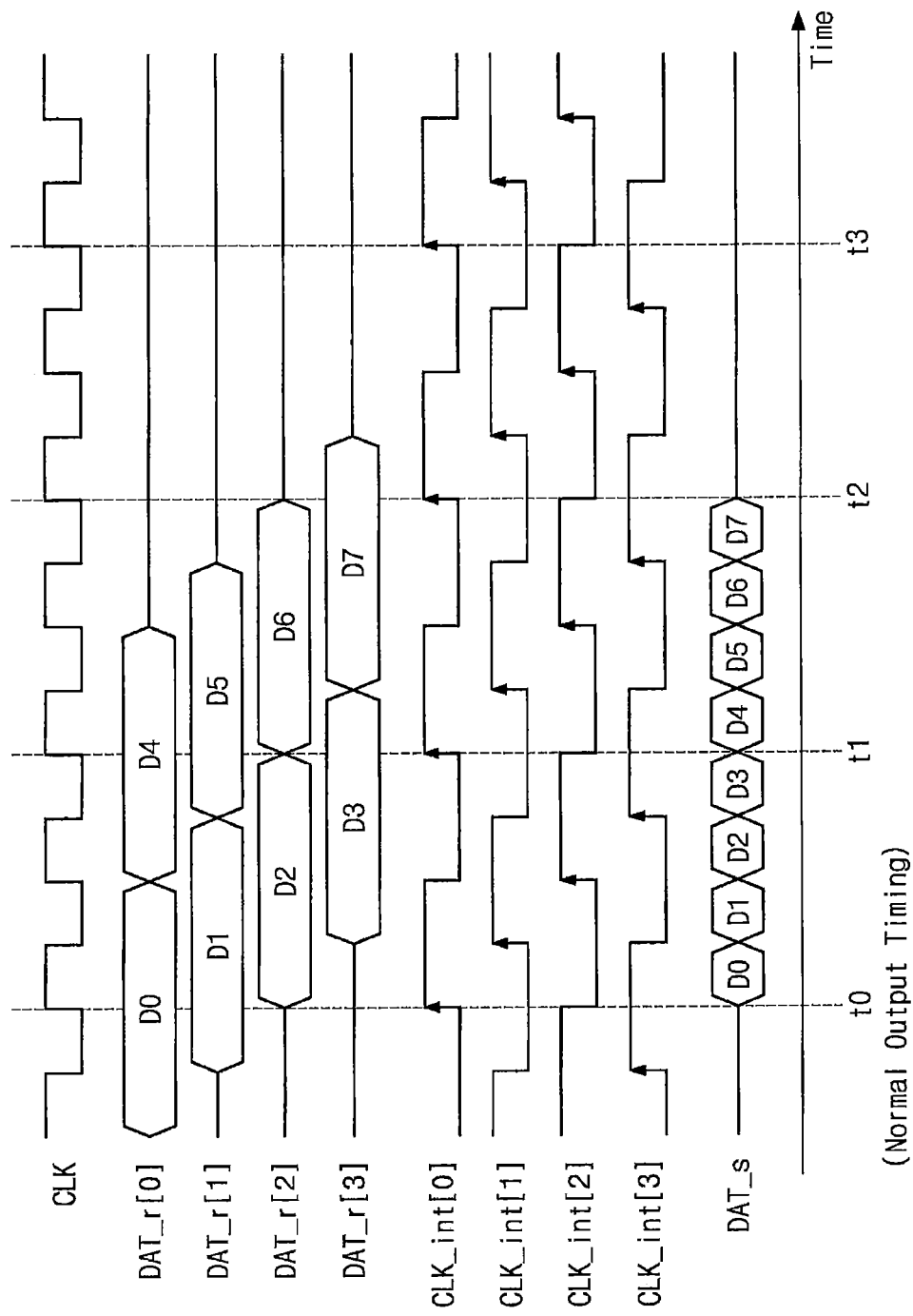
FIG. 14 is a timing diagram illustrating a data serialization process if the memory device in FIG. 11 operates according to the divided clock correction method of FIG. 12.

FIG. 14 is a timing diagram illustrating a data serialization process if the memory device of FIG. 11 operates according to a clock correction method of FIG. 12. The timing diagram of FIG. 14 will be described with reference to FIGS. 10 and 11. As described above, each of first to fourth internal clock signals CLK_int[0:3] operates at half of a frequency of a clock signal CLK.

In FIG. 13, when serial data DAT_s is output while an output time point of the serial data DAT_s is delayed compared to an expected data output time point of the serial data DAT_s, the host 20 may sense the delay and may provide the memory device 200 with an MRS command for correcting a clock dividing start time point. The clock dividing start time point of the internal clock generator 260 is delayed by one period of the clock signal CLK or is moved up by one period of the clock signal CLK, based on a control signal CTRL generated by the clock controller 270 in response to the provided MRS command. Referring to FIG. 14, there is illustrated the serial data DAT_s output when the clock dividing start time point of the internal clock generator 260 is corrected.

From time t0 to time t1, the serializer 230 serializes the first to fourth register data DAT_r[0:3] using the first to fourth internal clock signals CLK_int[0:3], respectively. Accordingly, first to fourth data D0 to D3 are sequentially output as the serial data DAT_s from time t0.

As in an operation from time t0 to time t1, from time t1 to time t2, the serializer 230 serializes the first to fourth register data DAT_r[0:3] using the first to fourth internal clock signals CLK_int[0:3], respectively. Fifth to eighth data D4 to D7 are sequentially output as the serial data DATs from time t1. After time t2, the serial data DAT_s is not output.

In FIG. 14, the first to eighth data D0 to D7 are sequentially output as serial data DAT_s starting at time t0. As a result, when the clock dividing start time point is corrected by one period of the clock signal CLK, the serial data DAT_s is output to the host 20 starting at time t0, which is moved up by one period of the clock signal CLK as compared to an output time point of the serial data DAT_s before the clock dividing start time point was corrected.

According to embodiments of the inventive concepts, a memory device and a divided clock correction method thereof may correct a clock dividing start time point of a data-dedicated clock without dependency of a command/address-dedicated C/A clock signal. Accordingly, a clock dividing start time point may be controlled regardless of a timing margin between the C/A clock signal and the data-dedicated clock signal or the quality of the C/A clock signal.

The above-mentioned description refers to embodiments for implementing the scope of the inventive concepts. Embodiments in which a design is changed simply or which are easily changed may be included in the scope of the inventive concepts as well as an embodiment described above. In addition, technologies that are easily changed and implemented by using the above-mentioned embodiments may be also included in the scope of the inventive concepts.

What is claimed is:

1. A memory device comprising:
an internal clock generator that is configured to generate a plurality of internal clock signals by dividing a received clock signal, where each of the internal clock signals has a respective phase that is different from the phases of the other internal clock signals;
a serializer that is configured to use the internal clock signals to serialize training data;
a data output buffer that is configured to output the serialized training data; and
a clock controller that is configured to correct a clock dividing start time point of the received clock signal based on a control signal provided by a host,
wherein a value of the control signal is based on a time that the serialized training data was received at the host.

2. The memory device of claim 1, wherein a data output buffer that is configured to output the serialized training data through a dedicated EDC pad is distinguished from a data pad through which write data is output.

3. The memory device of claim 1, wherein the control signal comprises a mode register set code.

4. The memory device of claim 1, further comprising a register that stores the training data prior to serialization of the training data.

5. The memory device of claim 4, wherein the training data is provided to the memory device from the host.

6. The memory device of claim 5, wherein a data rate of the serialized training data is greater than a data rate of the training data from the register.

7. The memory device of claim 3, wherein the control signal that is received from the host has a different value than a prior version of the control signal that is stored in the memory device when the serialized training data is received out of order at the host.

8. A method for correcting a clock dividing start time point of a memory device, the method comprising:
sampling serial test data that is received from a host using a plurality of internal clock signals to deserialize the serial test data, wherein the serial test data is sampled using one of a rising edge or a falling edge of each of the internal clock signals; and
configuring the memory device to sample data that is received from the host using an other one of the rising edge or the falling edge of each of the internal clock signals responsive to a determination that the deserialized serial test data was deserialized out of order.

9. The method of claim 8, wherein the internal clock signals are generated by dividing a clock signal that is received from the host.

10. The method of claim 9, further comprising aligning the deserialized serial test data to generate aligned test data.

11. The method of claim 10, further comprising comparing the aligned test data to reference data to determine if the serial test data was deserialized out of order.

12. The method of claim 8, wherein each of the internal clock signals has a respective phase that is different from the phases of the other internal clock signals.

13. A method for correcting a clock dividing start time point of a memory device, the method comprising:
serializing test data to provide a serialized data pattern using a plurality of internal clock signals that are generated by dividing a clock signal that is received from the host;
comparing reference data with the serialized data pattern; and
correcting the clock dividing start time point of the clock signal based on the comparison of the reference data with the serialized data pattern.

* * * * *